United States Patent
Hernandez

(10) Patent No.: US 6,580,660 B1
(45) Date of Patent: Jun. 17, 2003

(54) CIRCUIT AND METHOD FOR SYNCHRONIZING MULTIPLE DIGITAL DATA PATHS

(75) Inventor: Adrian M. Hernandez, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/060,181

(22) Filed: Jan. 30, 2002

(51) Int. Cl.[7] .................................................. G11C 8/00
(52) U.S. Cl. .................. 365/233; 365/230.05; 365/194; 365/189.01
(58) Field of Search ........................... 365/233, 230.05, 365/194, 189.01

(56) References Cited

U.S. PATENT DOCUMENTS

| | | | |
|---|---|---|---|
| 4,173,007 A | | 10/1979 | McKeighen et al. ......... 367/11 |
| 4,374,400 A | | 2/1983 | Holmes ....................... 358/167 |
| 4,833,651 A | * | 5/1989 | Seltzer et al. ........... 365/189.07 |
| 5,825,713 A | * | 10/1998 | Lee ......................... 365/230.05 |
| 5,956,748 A | * | 9/1999 | New .......................... 711/149 |
| 6,473,357 B1 | * | 10/2002 | Fan et al. ............... 365/230.05 |

* cited by examiner

Primary Examiner—David Nelms
Assistant Examiner—Connie C. Yoha
(74) Attorney, Agent, or Firm—Kyle J. Way

(57) ABSTRACT

A circuit and method according to an embodiment of the invention synchronize multiple digital data paths, each containing a set of digital data signals and an associated clock signal. The circuit includes a dual-port memory having a first port configured to store samples of each set of digital data signals by way of the clock signal associated with each set. A second port of the memory is configured to retrieve the stored samples, with the retrieval of the samples being timed so that each of the sets of digital data signals is synchronized with each other and with one of the clock signals.

3 Claims, 5 Drawing Sheets

CIRCUIT AND METHOD FOR SYNCHRONIZING MULTIPLE DIGITAL DATA PATHS

BACKGROUND OF THE INVENTION

With the speeds of digital electronic circuit technology persistently increasing, problems involving signal synchronization have become more prevalent. Consider the situation of multiple parallel digital data paths, each of which consists of one or more digital data signals accompanied by an associated clock signal. Such multiple data paths may be the result of a single parallel data path that has been split, with each resulting path including a copy of the clock signal associated with the original data path. In many circuits, these multiple data paths may take different physical routes within a circuit. In such cases, a synchronization problem may arise between the multiple data paths if they are to be combined at some physical point in the circuit, assuming that the clock signals involved are all of substantially the same frequency. In other words, the signals of some of the data paths are likely to be shifted in time compared to the signals of other paths.

This phenomenon is depicted in the timing diagram of FIG. 1, wherein DATA 0 and DATA 1 are portions of the same original data path that have been split. CLK 0 and CLK 1 are copies of the clock originally associated with the digital data path prior to the data path being separated. Each segment of DATA 0 and DATA 1 in the figure, such as $A_0$, $B_0$, and the like, is a "sample," which is the digital state of the data signals associated with each clock pulse of CLK 0 and CLK 1, respectively. As shown in FIG. 1, the various portions of the digital data path may be skewed by multiple clock cycles, causing a problem if the portions of the data path must be recombined. For example, $A_0$ and $A_1$ are samples of DATA 0 and DATA 1 that are desired to be synchronous; the same is true of $B_0$ and $B_1$, $C_0$ and $C_1$, and so on.

Several solutions to such synchronization problems have been utilized in the past. For instance, advancing or delaying the original clock signal would sometimes yield a point in time at which the all of the data was synchronized. However, in cases such as FIG. 1, in which portions of the data path are out of synchronization by multiple clock cycles, no such point in time at which synchronization may be achieved exists.

An alternate solution would be to add delay lines to some or all of the digital data signals in one or more data paths so that each data signal could be delayed varying amounts so that the resulting data paths ultimately could be synchronized. Unfortunately, no commercial electronic components are believed to be currently available which provide programmable multi-signal delay lines. Such parts could be produced in a custom manner, but would most likely be rather expensive to implement. Additionally, calibration of several programmable delay lines to find the optimum delay values for synchronization purposes may require an inordinate amount of time.

Another possibility is that the frequency of the clock signals involved could be reduced so that the timing differences between the various multiple data paths would be insignificant compared to the clock period, thereby eliminating any synchronization problems. Of course, such a solution is not ordinarily desirable due to the deleterious effect on the performance of the circuit.

Therefore, from the foregoing, a new circuit and method that allows for comparatively inexpensive and easily calibrated synchronization of multiple digital data paths would be advantageous.

SUMMARY OF THE INVENTION

Embodiments of the present invention, to be discussed in detail below, allow a circuit for synchronizing multiple digital data paths, each of which includes a set of digital data signals and an associated clock signal. The embodiments include a dual-port memory associated with each data path. Each memory is employed to store samples of each of the sets of digital data signals by way of the clock signal associated with that set of digital data signals. Each memory is also configured so that the samples stored in each of the memories is retrieved at a time such that each of the sets is synchronized with each other and with one of the clock signals.

Another embodiment of the invention takes the form of a method of synchronizing multiple digital data paths. Samples of each of the digital data signals from each of the paths are stored by way of the clock signal associated with that set of digital data signals. The samples of each set of digital data signals are then retrieved at a time such that each of the sets of digital data signals is synchronized with each other and with one of the clock signals.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

The embodiments of the invention, which are described below, synchronize multiple digital data paths, with each path including a set of digital data signals and an associated clock signal, such as those referred to earlier in FIG. 1.

Figure 2:
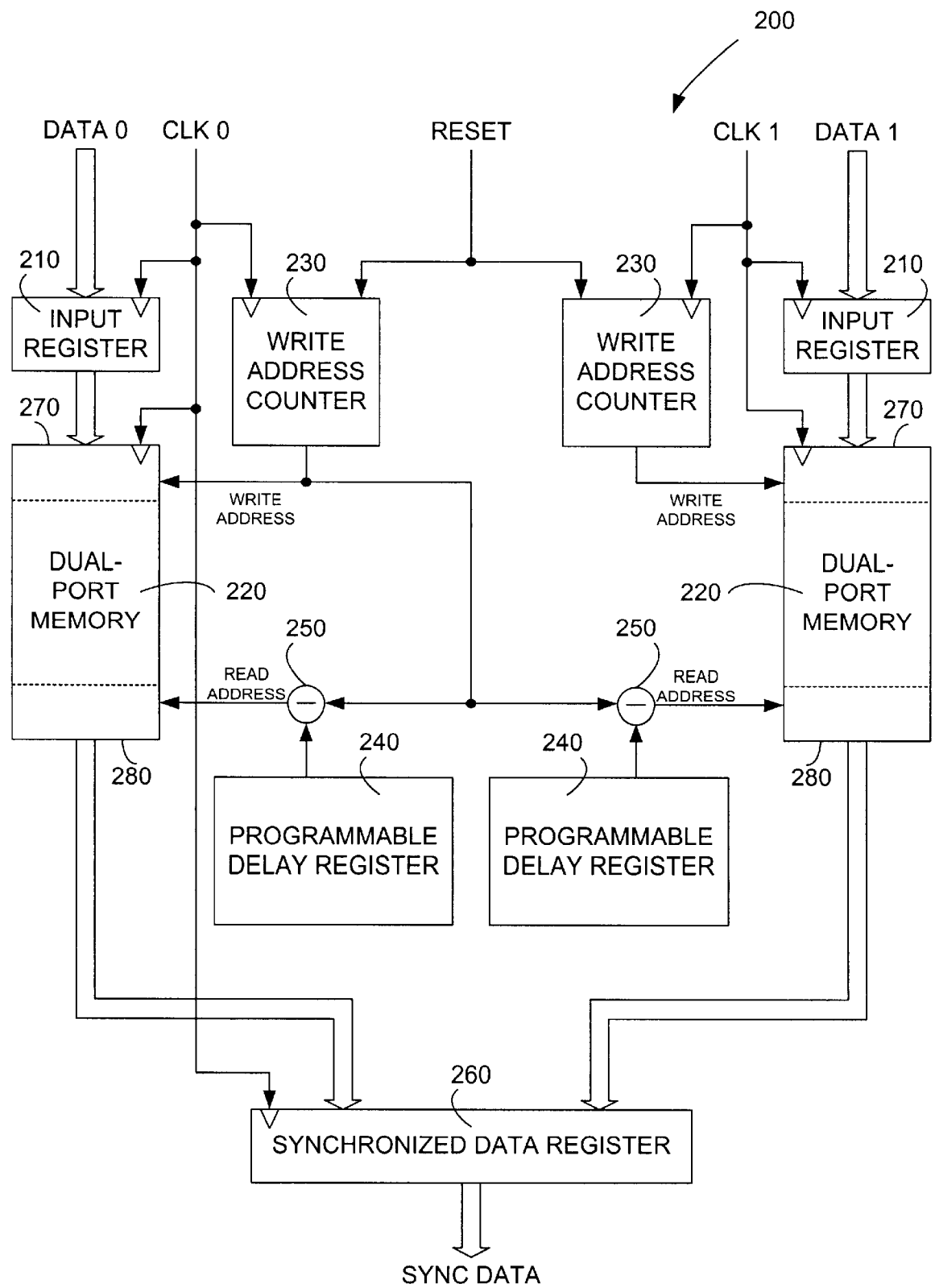
FIG. 2 is a block diagram of a circuit that synchronizes two sets of digital data signals and their associated clock signals, similar to those referred to in FIG. 1, according to an embodiment of the invention.

One embodiment of the invention is shown in FIG. 2 in the form of a synchronization circuit 200 that synchronizes two distinct digital data paths, comprising sets of digital data signals, DATA 0 and DATA 1, and associated clock signals CLK 0 and CLK 1. Although the circuit 200 processes only two distinct, unsynchronized sets of digital data signals, other embodiments of the invention not specifically enumerated herein are capable of synchronizing any number of unsynchronized digital data paths. By way of pictorial explanation in FIG. 3, a synchronization circuit 300 is displayed that is configured to synchronize 'N' separate digital data paths.

In the embodiment of FIG. 2, samples of the digital data signals of each data path are stored in an independent dual-port memory 220, which allows asynchronous access from two different ports to the same portion of memory. Several different types of memory structures known in the art may be used as dual-port memory 220, including, but not limited to, dual-port random-access memories (RAMs), which allow read and write access from both ports, and first-in-first-out (FIFO) memories, which allow sequential write access from one port, and sequential read access from another port.

In the embodiment of FIG. 2, each dual-port memory 220 has a first port 270 through which samples of each digital data path are stored. Likewise, a second port 280 is utilized to retrieve those same samples from each dual-port memory 220.

Initially, data from each digital data path is written to an input register 210, which is employed to ensure that the data for that path (for example, DATA 0) is appropriately timed with respect to the associated clock signal (for example, CLK 0) so that the setup and hold times for dual-port memory 220 are met. Alternately, if the timing relationship between the digital data signals and the associated clock signal is known to be acceptable to dual-port memory 220, input register 210 is not necessary in that case, and the digital data signals are transferred directly to dual-port memory 220 via first port 270.

The write address for first port 270 of each dual-port memory 220 is generated by a write address counter 230, which counts up one address for each clock pulse received from the associated clock signal. Alternately, some embodiments may not require the use of a write address counter. For example, a FIFO memory assumes that the next sequential location in memory is to be written upon the receipt of a clock signal pulse. Each write address counter 230 associated with a digital data path also may be reset via a RESET signal so that all write address counters 230 may exhibit the same address value within one clock period.

As a result of the foregoing structure, samples of each of the sets of digital data signals are stored separately in associated dual-port memories 220 for later retrieval at a time allowing for synchronization of each data set with those of other data paths.

A second port 280 identified with each dual-port memory 220 is then utilized to retrieve the previously stored samples of the digital data signals identified with that particular dual-port memory 220. The retrieval of the samples is timed by way of the current write address used for a single selected dual-port memory 220 and a value stored in a programmable delay register 240 identified with the particular dual-port memory 220. The value from the delay register 240 is subtracted from the current selected write address by way of an arithmetic unit 250 associated with each delay register 240 to yield a read address for dual-port memory 220 that is identified with the particular delay register 240. A single write address from one of the write address counters 230 is employed to aid in synchronization of the various sets of digital data signals, as each of the read addresses will change at substantially the same time. In the embodiment of FIG. 2, write address counter 230 for DATA 0 is employed to drive both arithmetic units 250. The larger the value programmed into delay register 240, the longer the delay between the time the data samples are stored in dual-port memory 220 and the time those samples are retrieved. In most embodiments, the subtraction performed by arithmetic unit 250 is of the "circular" variety, whereby a write address value that is smaller than the value in delay register 240 results in a read address at the extreme upper end of the address space of dual-port memory 220. This ability is desirable in cases where dual-port memory 220 is employed as a circular buffer so that samples of the digital data signals identified with dual-port memory 220 may be continuously stored and retrieved without any resetting of the write or read addresses.

All samples of digital data signals retrieved from the various dual-port memories 220 are transferred to a synchronized data register 260, stored via the same clock signal associated with the write address counter 230 which generates the write address used by all arithmetic units 250. In the case of the embodiment of FIG. 2, CLK 0 is utilized for that purpose, allowing all of the data samples retrieved from dual-port memories 220 to be presented simultaneously as SYNC DATA at the output of synchronized data register 260.

Alternately, in some applications, synchronized data register 260 may not be necessary if the differences in propagation times between the various write address counters 230, arithmetic units 250 and dual-port memories 220 are not critical to the particular application in which circuit 200 is employed. In that case, the outputs of second port 280 of each of dual-port memories 220 would be used collectively as the synchronized data desired in the particular application involved.

Figure 1:
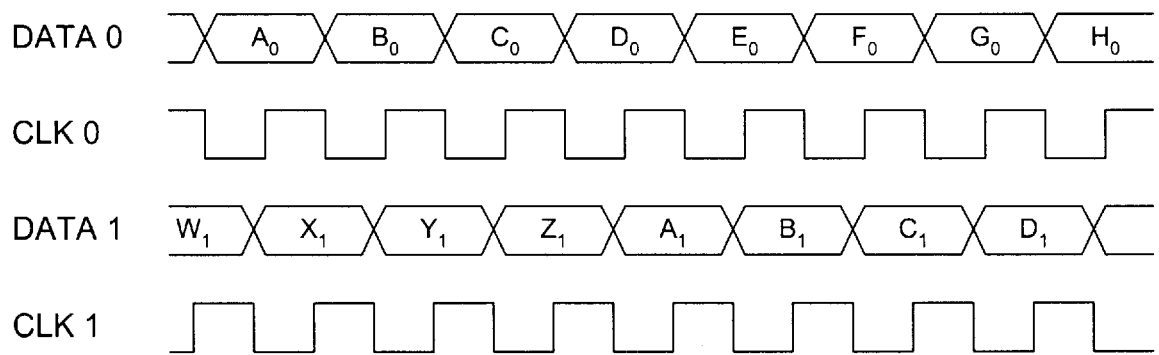
FIG. 1 is a timing diagram exhibiting a lack of synchronization between two sets of digital data signals and their associated clock signals.
Figure 3:
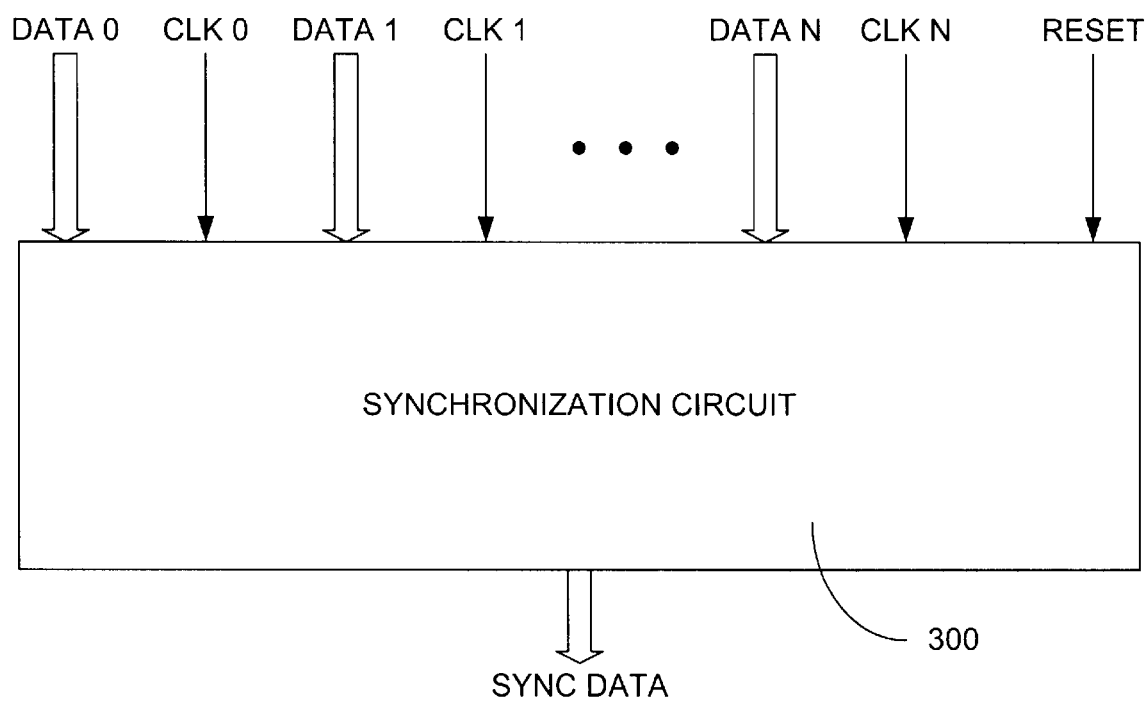
FIG. 3 is a block diagram representing an extension of the circuit of FIG. 2 to applications involving more than two sets of digital data signals.

FIG. 3 indicates via a set of timing diagrams how the embodiment of FIG. 2 operates, utilizing the same data shown in FIG. 1. DATA 0 and DATA 1 are first written to their respective input registers 210, ensuring that those digital data signals are aligned with their respective clock signals, CLK 0 and CLK 1. Each sample stored in input registers 210 is then written to its associated dual-port memory 220 on the next pulse of the same clock signal.

The synchronization of the two sets of digital data signals is then accomplished by the choice of values programmed into the two delay registers 240. Samples of DATA 1, being delayed in comparison to DATA 0 at the input of circuit 200, should spend less time in dual-port memory 220 in order to be synchronized with DATA 0, resulting in a smaller delay value than that associated with DATA 0. In the diagram of FIG. 3, a delay value of six is used for DATA 0 because, as shown in FIG. 3, write address counter 230 for DATA 0 holds a value of N+6 at the time data sample $A_0$, which was stored at location N, is read. DATA 1, being later that DATA 0 originally, uses a smaller delay value of three, since data sample $A_1$ was stored at memory location N+3.

The data from the dual-port memories 220 are then clocked into synchronized data register 260 by a single clock signal, which, in the embodiment of FIG. 2, is CLK 0. The data stored at each clock cycle in that register is synchronized, as shown by the notation $A_0:A_1$, $B_0:B_1$, and so on, as the result of the varying delays implemented by each dual-port memory 220. However, since the read addresses for the data samples read from the various dual-port memories 220 are all generated by way of a single write address counter 230, the data samples are generally read from all dual-port memories 220 at substantially the same time. As a result, some applications may not require the use of synchronized data register 260, as stated earlier.

As can be seen, proper calibration by way of setting programmable delay registers 240 is necessary for the proper operation of circuit 200. Unlike the use of discrete delay lines for each digital data signal involved, which potentially would require programming a register for each data signal of each data path, embodiments of the present invention disclosed herein require only as many registers to be programmed as there are paths. By the use of known test patterns for the digital data signals, as few as two iterations could be used to set delay registers 240 (from FIG. 2) for proper synchronization. The first iteration would be used to determine how far off the various data paths were from synchronization, and the second would be used to set delay registers 240 with their correct values. Thus, with a simplified calibration scheme possible, setting of delay registers 240 possibly may be accomplished in hardware upon reset of circuit 200.

Figure 4:
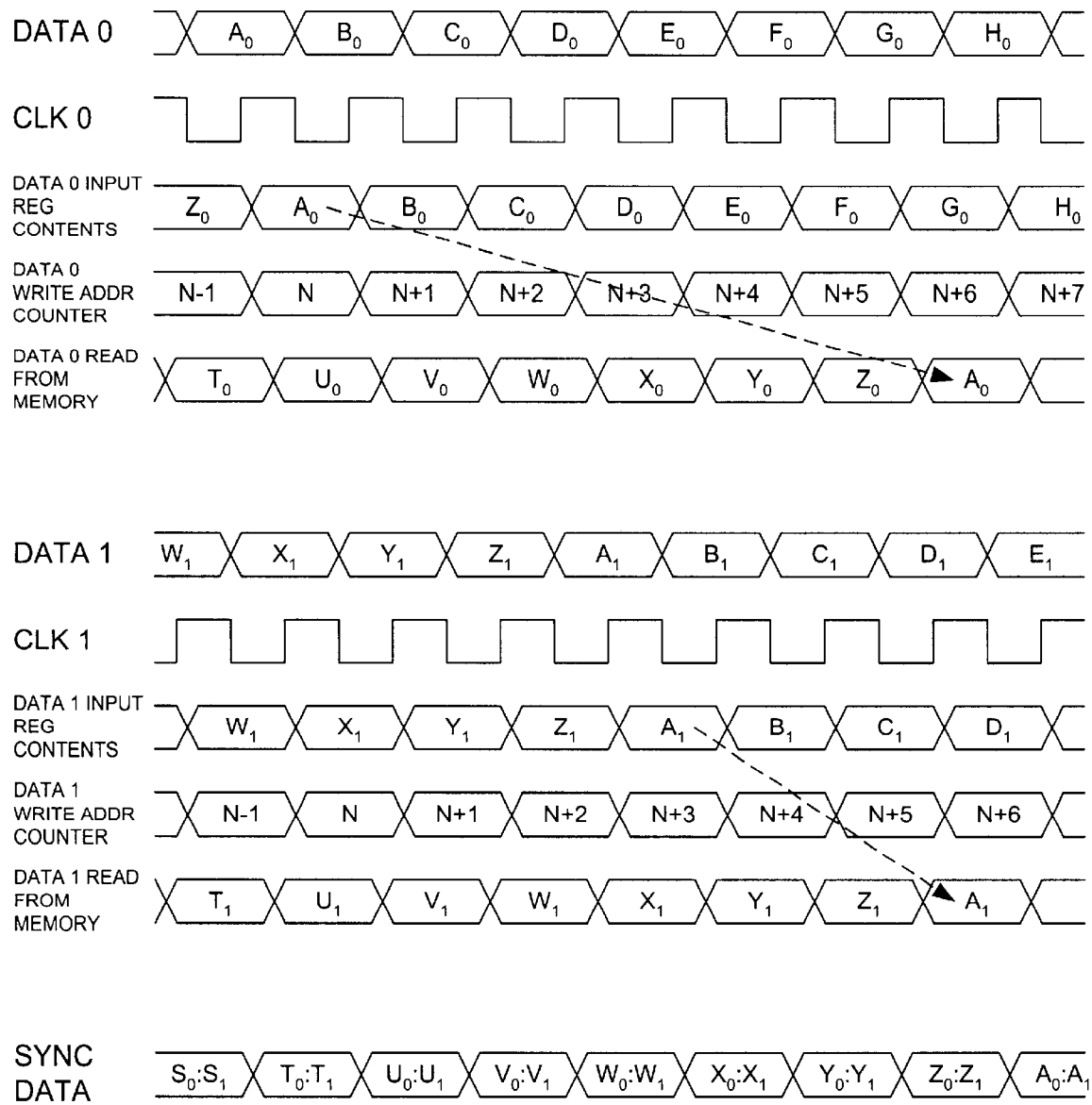
FIG. 4 is a timing diagram of the data signals resulting from synchronization of the two sets of digital data signals exhibited in FIG. 1 as performed by the embodiment of the invention shown in FIG. 2.
Figure 5:
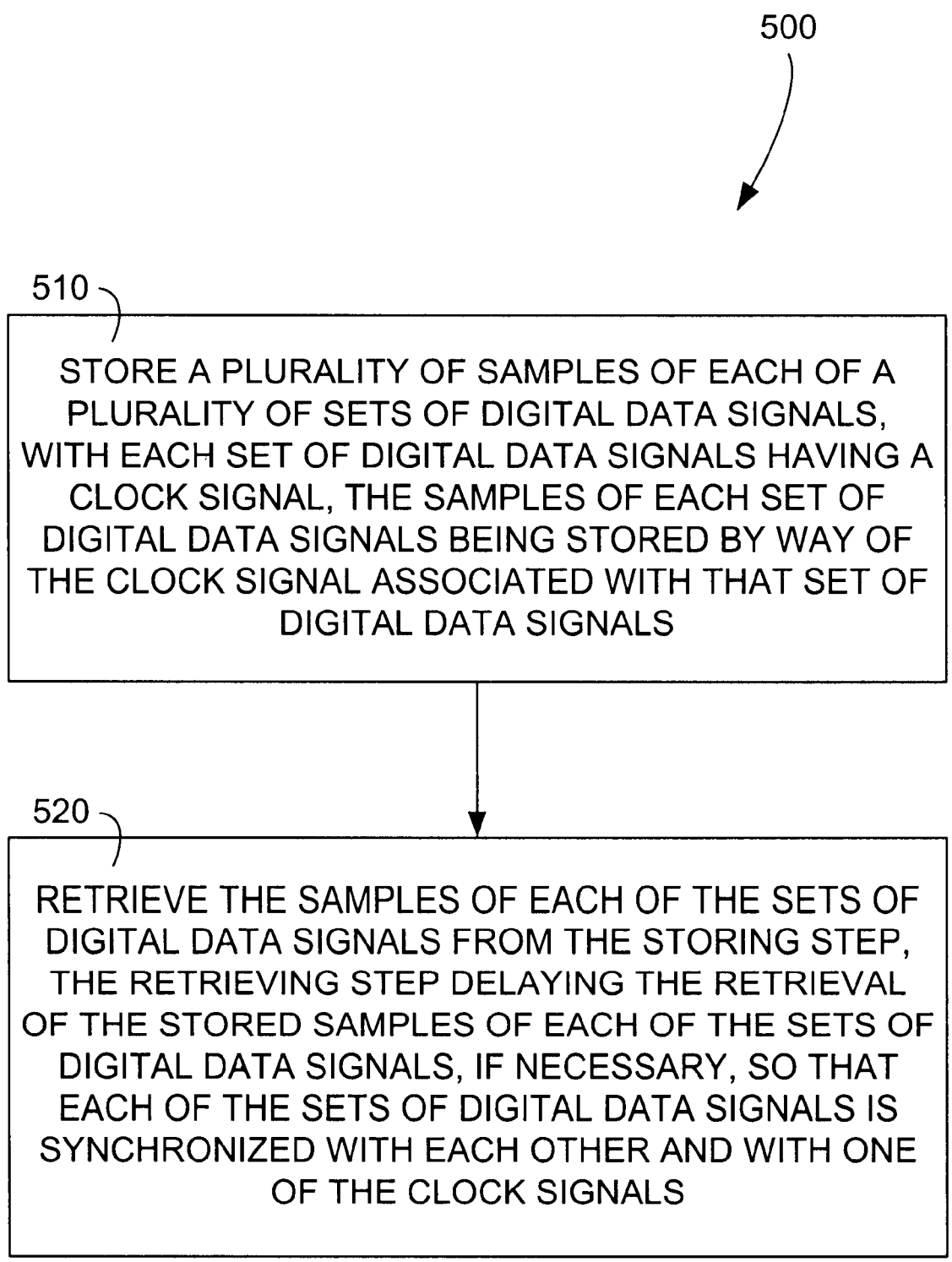
FIG. 5 is a flowchart showing a method of synchronizing multiple digital data paths according to an embodiment of the invention.

Embodiments of the present invention may also take the form of a method of synchronizing multiple digital data paths, with each path containing a set of digital data signals and an associated clock signal. As shown in FIG. 4, method 400 includes two primary steps. First, a plurality of samples of each set of digital data signals are stored by way of the clock signal for that set of data signals (step 410). The stored samples for each set are then retrieved, with the retrieval for each set of data signals being delayed, if necessary, so that each of the sets of data signals is synchronized with each other, and with the clock signal of one of the sets of data signals (step 420).

From the foregoing, the embodiments of the invention discussed above have been shown to provide a circuit and method of synchronizing multiple digital data paths. In addition, other specific circuits and methods embodying the invention are also possible. Therefore, the present invention is not to be limited to the specific forms so described and illustrated; the invention is limited only by the claims.

What is claimed is:

1. A digital circuit for synchronizing a plurality of sets of digital data signals, with each of the sets of digital data signals having a clock signal, the circuit comprising:

a plurality of dual-port memories, each memory being independently associated with one of the sets of digital data signals, each memory having write address inputs, read address inputs, write data inputs, a write clock input, and read data outputs, the write data inputs of each dual-port memory being coupled with one of the sets of digital data signals;

a plurality of write address counters, each counter being independently associated with one of the dual-port memories, each counter being configured to drive the write address inputs of the associated dual-port memory, each counter having a clock input driven by the clock signal associated with the set of digital data signals that drive the write data inputs of the associated dual-port memory, each counter having a reset signal input that, when activated, resets the value of the counter;

a plurality of programmable delay registers, each delay register being independently associated with one of the dual-port memories; and a plurality of arithmetic units, each arithmetic unit being independently associated with one of the dual-port memories, each arithmetic unit having a first input and a second input, each arithmetic unit configured to subtract the value of the first input from the value of a second input, each arithmetic unit having an output representing the difference between the first and second inputs, the first input of each arithmetic unit being driven by the programmable delay register associated with the memory that is associated with the arithmetic unit, the second input of all arithmetic units being driven by one of the write address counters, the output of each arithmetic unit driving the read address inputs of the memory associated with the arithmetic unit.

2. The circuit of claim 1, further comprising:

a synchronized data register having inputs driven by the combined read data outputs of all of the dual-port memories, the synchronized data register having a clock input being driven by the same clock signal used to clock the write address counter that drives all of the arithmetic units.

3. The circuit of claim 1, further comprising:

a plurality of input registers, each input register being independently associated with one of the dual-port memories, each input register having a data input driven by the set of digital data signals associated with the dual-port memory that is associated with the particular input register, each input register having a data output that drives the write data inputs of the dual-port memory with which that input register is associated.

* * * * *